United States Patent [19]
Wanat et al.

[11] Patent Number: 5,853,947
[45] Date of Patent: *Dec. 29, 1998

[54] QUINONEDIAZIDE POSITIVE PHOTORESIST UTILIZING MIXED SOLVENT CONSISTING ESSENTIALLY OF 3-METHYL-3-METHOXY BUTANOL AND PROPYLENE GLYCOL ALKYL ETHER ACETATE

[75] Inventors: Stanley F. Wanat, Scotch Plains; M. Dalil Rahman; Dinesh N. Khanna, both of Flemington, all of N.J.; Daniel P. Aubin, Voluntown, Conn.; Sunit S. Dixit, Flemington, N.J.

[73] Assignee: Clariant Finance (BVI) Limited, Virgin Islands (Br.)

[*] Notice: This patent issued on a continued prosecution application filed under 37 CFR 1.53(d), and is subject to the twenty year patent term provisions of 35 U.S.C. 154(a)(2).

[21] Appl. No.: 576,748

[22] Filed: Dec. 21, 1995

[51] Int. Cl.$^6$ .............................. G03F 7/023; G03C 1/61
[52] U.S. Cl. ..................... 430/165; 430/169; 430/191; 430/192; 430/193
[58] Field of Search ................... 430/191, 165, 430/169, 192, 193

[56] References Cited

U.S. PATENT DOCUMENTS

| | | |
|---|---|---|
| 2,797,213 | 6/1957 | Moore . |
| 3,106,465 | 10/1963 | Neugebauer et al. . |
| 3,130,047 | 4/1964 | Uhlig et al. . |
| 3,148,983 | 9/1964 | Endermann et al. . |
| 3,201,329 | 8/1965 | Burt . |
| 3,666,473 | 5/1972 | Colom et al. . |
| 3,785,825 | 1/1974 | Deutsch et al. . |
| 3,802,885 | 4/1974 | Lawson et al. . |
| 3,869,292 | 3/1975 | Peters . |
| 4,115,128 | 9/1978 | Kita . |
| 4,173,470 | 11/1979 | Fahrenholtz et al. ................. 430/5 |
| 4,439,516 | 3/1984 | Cernigliaro et al. ................. 430/323 |
| 4,550,069 | 10/1985 | Pampalone ................. 430/165 |
| 4,822,713 | 4/1989 | Nishioka et al. ................. 430/191 |
| 5,066,561 | 11/1991 | Pampalone ................. 430/169 |
| 5,143,814 | 9/1992 | Pampalone ................. 430/165 |

FOREIGN PATENT DOCUMENTS 260994  3/1988  European Pat. Off. .

OTHER PUBLICATIONS

Chemistry & Application of Phenolic Resins, Chapter 4.
JP 4009064 Sumitomo Chemical Jan. 1992—Abstract.
JP 4009852 Sumitomo Chemical Jan. 1992—Abstract.

*Primary Examiner*—Christopher G. Young
*Attorney, Agent, or Firm*—Andrew F. Sayko, Jr.

[57] ABSTRACT

A photosensitive positive working photosensitive composition suitable for use as a photoresist, which comprises an admixture of at least one water insoluble, aqueous alkali soluble, film forming novolak resin; at least one o-diazonaphthoquinone photosensitizer; and a photoresist solvent mixture comprising a propylene glycol alkyl ether acetate and 3-methyl-3-methoxy butanol and process for producing such a composition.

12 Claims, No Drawings

QUINONEDIAZIDE POSITIVE PHOTORESIST UTILIZING MIXED SOLVENT CONSISTING ESSENTIALLY OF 3-METHYL-3-METHOXY BUTANOL AND PROPYLENE GLYCOL ALKYL ETHER ACETATE

BACKGROUND OF THE INVENTION

The present invention relates to a process for preparing radiation sensitive positive photoresist compositions and particularly such compositions containing film forming novolak resins together with a diazonaphthoquinone photosensitizer agent. It is well known in the art to produce positive photoresist formulations, such as those described in U.S. Pat. Nos. 3,666,473, 4,115,128 and 4,173,470. These include alkali soluble phenol-formaldehyde novolak resins together with light sensitive materials, usually a substituted diazonaphthoquinone compound. The resin and photosensitizer are dissolved in an organic solvent, or mixture of solvents, and are applied as a thin film or coating to a substrate suitable for the particular application desired.

The water insoluble, film forming novolak resin component of these photoresist formulations is soluble in an alkaline aqueous solution, but the diazonaphthoquinone sensitizer acts as a dissolution rate inhibitor with respect to the resin. Upon exposure of selected areas of the coated substrate to actinic radiation, however, the sensitizer undergoes a radiation induced structural transformation, and the exposed areas of the coating are rendered more soluble than the unexposed areas. This difference in solubility rates causes the exposed areas of the photoresist coating to be dissolved when the substrate is immersed in an alkaline developing solution while the unexposed areas are largely unaffected, thus producing a positive relief pattern on the substrate.

In most instances, the exposed and developed substrate will be subject to treatment by a substrate etchant solution or gas plasma. The photoresist coating protects the coated areas of the substrate from the etchant and thus the etchant is only able to etch the uncoated areas of the substrate which, in the case of a positive photoresist, correspond to the areas that were exposed to actinic radiation. Thus, an etched pattern can be created on the substrate which corresponds to the pattern of the mask, stencil, template, etc. that was used to create selective exposure patterns on the coated substrate prior to development.

The relief pattern of photoresist on the substrate produced by the method described above is useful for various applications including, for example, as an exposure mask or a pattern such as is employed in the manufacture of miniaturized integrated electronic components. The properties of a photoresist composition which are important in commercial practice include the photospeed of the photoresist, development contrast, photoresist resolution and photoresist adhesion to the substrate.

Increased photospeed is important for a photoresist, particularly in applications where a number of exposures are needed, for example, in generating multiple patterns by a repeated process, or where light of reduced intensity is employed, such as in projection exposure techniques where the light is passed through a series of lenses and monochromatic filters. Thus, increased photospeed is particularly important for a photoresist composition employed in processes where a number of multiple exposures must be made to produce a mask or series of circuit patterns on a substrate. These optimum conditions include a constant development temperature and time in a particular development mode, and a developer system selected to provide complete development of exposed photoresist areas while maintaining a maximum unexposed photoresist film thickness loss not exceeding about 10 pecent of initial thickness.

Development contrast refers to a comparison between the percentage of film loss in the exposed area of development with the percentage of film loss in the unexposed area. Ordinarily, development of an exposed photoresist coated substrate is continued until the coating on the exposed area is substantially completely dissolved away. Thus, development contrast can be determined simply by measuring the percentage of the film coating loss in the unexposed areas when the exposed coating areas are entirely removed.

Photoresist resolution refers to the capability of a photoresist system to reproduce the smallest equally spaced line pairs and intervening spaces of a mask which is utilized during exposure, with a high degree of image edge acuity in the developed exposed spaces. In many industrial applications, particularly in the manufacture of miniaturized electronic components, a photoresist is required to provide a high degree of resolution for very small line and space widths (on the order of one micron [micrometer] or less).

The ability of a photoresist to reproduce very small dimensions of one micron (micrometer) or less, is extremely important in the production of large scale integrated circuits on silicon chips and similar components. Circuit density on such a chip can only be increased, assuming photolithographic techniques are utilized, by increasing the resolution capabilities of the photoresist. Although negative photoresists, wherein the exposed areas of photoresist coating become insoluble and the unexposed areas are dissolved away by the developer, have been extensively used for this purpose by the semiconductor industry, positive photoresists have inherently higher resolution and are utilized as replacements for the negative photoresists.

A problem with the use of conventional positive photoresists in the production of miniaturized integrated circuit components is that the positive photoresists generally have slower photospeed than their negative analogs. Various attempts have been made in the prior art to improve the photospeed of positive photoresist compositions. For example, in the U.S. Pat. No. 3,666,473, a mixture of two phenol formaldehyde novolak resins was used together with a typical sensitizer, the novolak resins being defined by their solubility rates in alkaline solutions of a particular pH and by their cloud points. In U.S. Pat. No. 4,115,128, a third component consisting of an organic acid cyclic anhydride was added to the phenolic resin and naphthoquinone diazide sensitizer to provide increased photospeed.

SUMMARY OF THE INVENTION

The present invention provides a process for producing an improved positive working photoresist which demonstrates substantially increased photospeed while retaining or improving the photoresist erosion rate, plasma etch rate and contrast. It has been unexpectedly found that such an improved photoresist can be formulated when the novolak resin and a photosensitizer, such as a diazonaphthoquinone, are blended with a photoresist solvent mixture comprising propylene glycol alkyl ether acetate (preferably propylene glycol methyl ether acetate—PGMEA) and 3-methoxy-3-methyl butanol (MMB). U.S. Pat. Nos. 4,550,069, 5,066,561 and 5,143,814 relate to the use of the propylene glycol alkyl ether acetates alone, while JP Patent Numbers 4,009,064 and 4,009852 teach the use of MMB alone as solvents for positive photoresists. The present invention indicates that a unique synergy exists when combining the two solvents wherein the combined solvent system imparts increased photosensitivity to photoresists formulated with the mixed system which is not found with either individual solvent.

The present invention relates to a positive working photosensitive composition suitable for use as a photoresist, which comprises an admixture of at least one water insoluble, aqueous alkali soluble, film forming novolak resin; at least one ortho-diazonaphthoquinone photosensitizer; and a photoresist solvent mixture comprising a propylene glycol alkyl ether acetate (preferably propylene glycol methyl ether acetate) and 3-methyl-3-methoxy butanol. The subject invention also relates to a photosensitive element which comprises a suitable substrate, such as a silicon wafer, and such a positive working photosensitive composition. In addition the invention relates to a process for producing a positive working composition suitable for use as a photoresists having increased photospeed, which process comprises forming an admixture of at least one water insoluble, aqueous alkali soluble, film forming novolak resin; at least one ortho-diazonaphthoquinone photosensitizer; and a photoresist solvent mixture comprising a propylene glycol ether alkyl ether acetate and 3-methyl-3-methoxy-butanol.

DETAILED DESCRIPTION OF THE PREFERRED EMBODIMENTS

The production of film forming, water insoluble, alkali soluble novolak resins, which may be used for preparing photosensitive compositions, is well known in the art. A procedure for their manufacture is described in Chemistry and Application of Phenolic Resins, Knop A. and Scheib, W.; Springer Verlag, N.Y., 1979 in Chapter 4 which is incorporated herein by reference. Paravinyl phenols and polyvinyl phenols are described in U.S. Pat. No. 3,869,292 and U.S. Pat. No. 4,439,516, which are incorporated herein by reference. Similarly, the use of o-diazonaphthoquinones is well known to the skilled artisan, as demonstrated by Light Sensitive Systems, Kosar, J.; John Wiley & Sons, N.Y., 1965 in Chapter 7.4, which is also incorporated herein by reference. These sensitizers which comprise a component of the process of the present invention are preferably substituted diazonaphthoquinone sensitizers, which are conventionally used in the art in positive photoresist formulations. Such sensitizing compounds are disclosed, for example, in U.S. Pat. Nos. 2,797,213, 3,106,465, 3,148,983, 3,130,047, 3,201,329, 3,785,825 and 3,802,885. Useful photosensitizers include, but are not limited to, the sulfonic acid esters made by condensing phenolic compounds such as hydroxy benzophenones with naphthoquinone-(1,2)-diazide-5-sulfonyl chloride or naphtho-quinone-(1,2)-diazide-4-sulfonyl chlorides.

In the preferred embodiment, the solid parts of the photoresist composition, the resin and the diazonaphthoquinone, preferably range from 15% to about 99% resin and from about 1% to about 85% diazonaphthoquinone. A more preferred range of resin would be from about 50% to about 90% and most preferably from about 65% to about 85% by weight of the solids photoresist components. A more preferred range of the diazonaphthoquinone would be from about 10% to about 50% and most preferably from about 15% to about 35%, by weight of the solid in the photoresist. In manufacturing the photoresist composition, the resin and the diazonaphthoquinone are mixed with the solvent mixture of propylene glycol alkyl ether acetate, preferably propylene glycolmethyl ether acetate (PGMEA) and 3-methyl-3-methoxy-butanol (MMB), such that the solvent mixture is present in an amount of from about 40% to about 90% by weight of the overall photoresist composition. A more prefered range is from about 60% to about 83% and most preferably from about 65% to about 70% by weight of the overall photoresist composition. Further, the prefered range of solvent ratios of propylene glycol alkyl ether acetate:MMB mixtures is from about 90%/10% to about 10%/90%. A more prefered solvent ratio range is from about 70%/30% to about 30%/70% and most preferably from about 60%/40% to about 40%/60% of the solvent mixture.

Additives such as colorants, dyes, anti-striation agents, plasticizers, adhesion promoters, coating aids, speed enhancers and surfactants may be added to the solution of novolak resin, sensitizer and solvent system before the solution is coated onto a substrate.

Examples of dye additives that may be used together with the photoresist compositions of the present invention may include, but are not limited to, Methyl Violet 2B (C.I. No. 42535), Crystal Violet (C.I. 42555), Malachite Green (C.I. No. 42000), Victoria Blue B (C.I. No. 045) and Neutral Red (C.I. No. 50040) at one to ten percent weight levels, based upon the combined weight of novolak and sensitizer. The dye additives help provide increased resolution by inhibiting back scattering of light from the substrate surface.

Anti-striation agents may be used up to 5 percent weight level based upon the combined weight of novolak and sensitizer.

Plasticizers which may be used include, for example, phosphoric acid tri-(beta-chloroethyl)-ester, stearic acid, dicamphor, polypropylene, acetal resins, phenoxy resins or alkyl resins at one to ten percent weight levels based upon the combined weight of novolak and sensitizer. The plasticizer additives are added to improve the coating properties of the material and enable the application of a film that is smooth and of uniform thickness to the substrate.

Adhesion promoters which may be used include, for example, beta-(3,4-epoxy-cyclohexyl)-ethyltrimethoxysilane or gamma-aminopropyl triethoxysilane up to a 4 percent weight level based upon the combined weight of novolak resin and sensitizer.

Speed enhancers that may be used include, for example, picric acid, nicotinic acid or nitrocinnamic acid at a weight level of up to 20 percent based upon the combined weight of novolak and sensitizer. These enhancers tend to increase the solubility of the photoresist coating in both the exposed and unexposed areas and, thus they are used in applications when speed of development is the overriding consideration even though some degree of contrast may be sacrificed; i.e. while exposed areas of the photoresist coating will be dissolved more quickly by the developer, the speed enhancers will also cause a larger loss of photoresist from the unexposed areas as well.

Additional photoresist solvents may be added to the photoresist solvent mixture of the present invention, but comprise less than 50% by weight of the photoresits solvent. Such additional solvents include xylene, butyl acetate and Cellosolve R acetate. Preferably no such additional solvents are employed in the solvent mixture of the present invention.

Non-ionic surfactants that may be used include, for example, nonylphenoxy poly(ethyleneoxy) ethanol, octylphenoxy (ethyleneoxy) ethanol, and dinonyl phenoxy poly(ethyleneoxy)ethanol at up to 10 percent weight levels based upon the combined weight of the novolak and sensitizer.

The prepared photoresist solution can be applied to a substrate by any conventional method used in the photoresist art including dipping, spraying, whirling and spin coating. When spin coating, for example, the photoresist solution can be adjusted as to the percentage of solids content in order to provide coating of the desired thickness given the type of spinning equipment utilized and the amount of time allowed for the spinninig process. Suitable substrates include silicon, aluminum, or polymeric resins, silicon dioxide, doped silicon dioxide, silicon nitride, tantalum, copper, polysilicon, ceramics and aluminum/copper mixtures.

The photoresist coatings produced by the above described procedure are particularly suitable for application to thermally grown silicon/silicon dioxide coated wafers such as are utilized in the production of microprocessors and other miniaturized integrated circuit components. An aluminum/aluminum oxide wafer can be used as well. The substrate may also be comprised of various polymers such as polyesters.

After the photoresist composition is coated onto the substrate, the substrate is heated at about 20° to 110° C. This temperature treatment is selected in order to reduce and control the concentration of residual solvents in the photoresist through evaporation while not causing substantial thermal degradation of the photosensitizer. In general, one desires to minimize the concentration of solvents and thus this temperature treatment is conducted until a substantial amount of the solvents has evaporated and a thin coating of photoresist composition, on the order of one micron (micrometer) in thickness, remains on the substrate. This treatment is normally conducted at temperatures in the range of from about 20° to about 110° C. In a prefered embodiment the temperature is conducted at from about 50° to about 110° C. A more prefered range is from about 80° to about 110° C. This treatment is conducted until the rate of change of solvent removal becomes relatively insignificant. The temperature and time selection depends upon the photoresist properties desired by the user as well as equipment used and commercially desired coating times. Commercially acceptable treatment times for hot plate treatment are those up to about 3 minutes, more preferably up to about 1 minute. In one example, a 30 second treatment at 90° C. is useful. In a convection oven, evaporation may take from 15 minutes to 1 hour or more. The coating is rendered non-tacky and it is within the contemplation of this invention that the dried coating contains residual solvent in an amount of from about 1–30%, preferably 5–20% and most preferably 8–12% based upon the weight of the dried coating. The coated substrate can then be exposed to actinic radiation especially ultraviolet radiation in any desired exposure pattern produced by use of usable negatives, positive masks, stencils, templates, etc. in a manner well known to the skilled artisan.

The exposed photoresist-coated substrates are next substantially immersed in an aqueous alkaline developing solution. The solution is preferably agitated, for example, by nitrogen burst agitation. Suitable developers non-exclusively include water solutions containing an alkali hydroxide, ammonium hydroxide or tetramethyl ammonium hydroxide. However, any othe suitable developer known to the skilled artisan may be employed. The substrates are allowed to remain in the developer until all, or substantially all, of the photoresist coating has been removed from the exposed areas.

After removal of the coated wafers from the developing solution, a post-development heat treatment or bake may be used to increase the coating adhesion and chemical photoresistance to etching solutions and other substances. The post-development heat treatment can comprise oven baking of the coating and substrate below the coating's softening point. This post exposure baking or heat treatment may be conducted at from about 95° C. to about 160° C., preferably 95° C. to 150° C. and more preferably 112° C. to 120° C. This heat treatment may be conducted with a hot plate system for from about 10 seconds to the time necessary to crosslink the resin. This normally ranges from 10 seconds to 90 seconds, more preferably from about 30 seconds to about 90 seconds and most preferably from 15 to 45 seconds. Durations for longer than 90 seconds are possible but do not generally provide any additional benefit. Longer times are required for convection oven baking. The time selected depends on the choice of composition components and the substrate used. In industrial applications, particularly in the manufacture of microcircuitry units on silicon/silicon dioxide-type substrates, the developed substrates may be treated with a buffered hydroflouric acid/base etching solution or gas plasma. The photoresist compositions of the present invention are photoresistant to acid/base etching solutions and gas plasma etching and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all percentages and parts are by weight.

EXAMPLE 1

A standard photoresist formulation was prepared as follows:

| | |
|---|---|
| Novolak Resin* | 20.1% |
| Photoactive Compound** | 4.3% |
| Coating Aid*** | 0.4% |
| Solvent (Propylene glycol methyl ether acetate) | 75.2% |
| | 100.00% |

*The Novolak resin is a phenol formaldehyde copolymer made by condensing a 70:30 mixture of p-cresol:m-cresol with formaldehyde at a mole ratio of 1 part total cresol to about 0.75 parts of formaldehyde. The resultant polymer has a Mw (weight average molecular weight) range of about 25,000 to 35,000.
**The photoactive component (diazonaphthoquinone) is a sulfonate ester formed by the condensation of 2,3,4-trihydroxybenzophenone with the 2,1,5-diazonaphthoquinone sulfonyl chloride such that the degree of esterification of the substituted benzophenone is about 45%.
***The coating aid is a proprietary material supplied by Monsanto and is a copolymer of ethyl acrylate and 2-ethylhexyl acrylate.

EXAMPLE 2

A second photoresist was prepared using the same components as listed in Example 1, except for the solvent composition, as follows:

| | |
|---|---|
| Novolak Resin of Example 1 | 20.1% |
| Photoactive Compound of Example 1 | 4.3% |
| Coating Aid of Example 1 | 0.4% |
| Propylene glycol methyl ether acetate (PGMEA) | 37.6% |
| 3-Methyl-3-methoxy-butanol (MMB) | 37.6% |
| | 100.0% |

Evaluation of Photosensitivity (Photospeed)

The photoresists of Examples 1 and 2 were spin coated onto silicon wafers at the nominal 1.5 micron (micrometer)

ideal thickness for this photoresist. The samples were exposed with a Nikon® i-line stepper having a 0.54 Numerical Apperture (NA) using a 110° C. soft bake for 60 seconds and a 110° C. post exposure bake for 60 seconds. These were then developed with AZ® 300 MIF 2.38% tetramethyl ammonium hydroxide developer for 52 seconds with a spray development.

The imaged samples were photographed using a high resolution scanning electron microscope (SEM) and the critical dimensions were measured from the photos. The ideal dose to print (DTP) could be measured for both sets of samples. At the same coating thickness, both samples measured comparable film loss in imaged areas and both photoresists could resolve lines down to 0.5 microns (micrometers). However, photoresist made with the mixed solvent system of PGMEA and MMB had 15–16% faster photospeed when compared to the photoresist made with PGMEA alone.

Lithographic Data

In order to resolve equal lines and spaces for the control sample (Example 1) 250 mjoules/cm$^2$ of light energy was required while the test material made with a mixture of PGMEA and MMB required only 215 mjoules/cm$^2$. Thus the test material could be exposed about 16% faster than the control material. Other characteristics such as exposure latitude, contrast etc. were essentially comparable for the samples.

What is claimed is:

1. A photosensitive positive working photoresist composition, which consists essentially of an admixture of from about 15% to about 99% based on the weight of the solids portion of said composition of at least one water insoluble, aqueous alkali soluble film forming novolak resin; from about 1% to about 85% based on the weight of the solids portion of said composition of at least one o-diazonaphthoquinone photosensitizer, and from about 40% to about 90% based on the weight of the overall photosensitive composition of a photoresist solvent composition consisting essentially of a propylene glycol alkyl ether acetate and 3-methyl-3-methoxy butanol, wherein the solvent consists essentially of from about 40% to about 60% by weight of 3-methyl-3-methoxy-butanol and from about 60% to about 40% by weight of propylene glycol alkyl ether acetate.

2. The composition of claim 1 wherein said propylene glycol alkyl ether acetate component is propylene glycol methyl ether acetate.

3. The composition of claim 1 further comprising one or more additives selected from the group consisting of colorants, anti-striation agents, plasticizers, adhesion promoters, speed enhancers, solvents and surfactants.

4. The composition of claim 1 wherein said diazonaphthoquinone component comprises one or more compounds selected from diazo sulfonyl chloride reaction products with hydroxy or polyhydroxy aryl compounds, aryl amines or polyamines.

5. The composition of claim 1 wherein said photosensitizer is the condensation product of 2,3,4-trihydroxybenzophenone with naphthoquinone-(1,2)-diazide-5-sulfonyl chloride at an esterification level of about 45%.

6. A photosensitive element which comprises a substrate and the composition of claim 1 disposed on said substrate.

7. The element of claim 6 wherein said substrate comprises one or more components selected from the group consisting of silicon, aluminum, polymeric resins, silicon dioxide, doped silicon dioxide, silicon nitride, tantalum, copper, polysilicon, ceramics and aluminum/copper mixtures.

8. A process for producing a positive working photoresist composition, which comprises forming an admixture consisting essentially of from about 15% to about 99% based on the weight of the solids portion of said composition of at least one water insoluble, aqueous alkali soluble, film forming novolak resin; from about 1% to about 85% based on the weight of the solids portion of said composition of at least one ortho-diazinaphthoquinone photosensitizer; and from about 40% to about 90% based on the weight of the overall photosensitive composition of a photoresist solvent consisting essentially of a propylene glycol alkyl ether acetate and 3-methyl-3-methoxy-butanol, wherein the solvent consists essentially of from about 40% to about 60% by weight of 3-methyl-3-methoxy-butanol and from about 60% to about 40% by weight of propylene glycol alkyl ether acetate.

9. The process of claim 8 wherein said propylene glycol alkyl ether acetate component is propylene glycol methyl ether acetate.

10. The process of claim 8 further comprising one or more additives selected from the group consisting of colorants, anti-striation agents, plasticizers, adhesion promoters, speed enhancers, solvents and surfactants.

11. The process of claim 8 wherein said diazonaphthoquinone component comprises one or more compounds selected from diazo sulfonyl chloride reaction products with hydroxy or polyhydroxy aryl compounds, aryl amines or polyamines.

12. The process of claim 8 wherein said photosensitizer is the condensation product of 2,3,4-trihydroxybenzophenonee with naphthoquinone-(1,2)-diazide-5-sulfonyl chloride at an esterification level of about 45%.

* * * * *